(12) United States Patent
Oguchi

(10) Patent No.: US 6,573,570 B2
(45) Date of Patent: Jun. 3, 2003

(54) SEMICONDUCTOR DEVICE HAVING CONTACT ELECTRODE TO SEMICONDUCTOR SUBSTRATE

(75) Inventor: Kumi Oguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/093,788

(22) Filed: Mar. 6, 2002

(65) Prior Publication Data

US 2002/0125539 A1 Sep. 12, 2002

(30) Foreign Application Priority Data

Mar. 6, 2001 (JP) ........................................ 2001-061448

(51) Int. Cl.[7] ............................................... H01L 29/76
(52) U.S. Cl. ........................ 257/382; 257/506; 257/752
(58) Field of Search ................................. 257/377, 382, 257/383, 384, 385, 389, 506, 752, 760

(56) References Cited

U.S. PATENT DOCUMENTS

| 4,929,992 A | * | 5/1990 | Thomas et al. ............. 257/382 |
| 4,945,070 A | * | 7/1990 | Hsu ........................... 438/224 |
| 5,475,240 A | * | 12/1995 | Sakamoto ..................... 257/67 |
| 5,706,164 A | * | 1/1998 | Jeng ......................... 361/321.4 |
| 6,072,221 A | * | 6/2000 | Hieda ......................... 257/382 |

FOREIGN PATENT DOCUMENTS

| JP | 10-074832 | 3/1998 |
| JP | 11-243194 | 9/1999 |
| JP | 2000-077535 | 3/2000 |

* cited by examiner

Primary Examiner—T. N. Quach
(74) Attorney, Agent, or Firm—Hogan & Hartson, LLP

(57) ABSTRACT

An isolation region is embedded in a semiconductor substrate. The height of the upper face of the isolation region is substantially equal to the height of the surface of the semiconductor substrate. A gate electrode is formed on a gate insulating film and over the isolation region. A first side face of the gate electrode is formed over the isolation region. A second side face of the gate electrode is formed over the active region. A field insulator is formed on the isolation region. A first side face of the field insulator contacts with the first side face of the gate electrode. A second side face of the field insulator is continuous with a plane obtained by extending the side face of the isolation region. A sidewall insulator has a sidewall contacting with the second side face of the field insulator and the second side face of the gate electrode.

14 Claims, 13 Drawing Sheets

SEMICONDUCTOR DEVICE HAVING CONTACT ELECTRODE TO SEMICONDUCTOR SUBSTRATE

CROSS REFERENCE TO RELATED APPLICATIONS

This application is based upon and claims the benefit of priority from prior Japanese Patent Application P2001-61448 filed on Mar. 6, 2001; the entire contents of which are incorporated by reference herein.

BACKGROUND OF THE INVENTION

The present invention relates to a semiconductor device having a contact electrode to a semiconductor substrate and its fabrication method, particularly to a highly integrated semiconductor device provided with a contact electrode close to an isolation region and its fabrication method.

Semiconductor devices are becoming increasingly highly densified. Because of the high densification of semiconductor devices, a method for forming an isolation region uses Shallow Trench Isolation (STI) method instead of local oxidation of silicon (LOCOS) method. In the case of the LOCOS method, the interval between metal oxide semiconductor (MOS) transistors increases. In the case of the STI method, a trench is formed in a semiconductor substrate and an insulating film is embedded in the trench. In the case of the STI method, it is possible to decrease the interval between MOS transistors depending on the interval between the trenches.

As shown in FIG. 1, an earlier semiconductor device has an isolation region 71 according to the STI method. A gate electrode 72 is formed on a semiconductor substrate 70 between the isolation regions 71. A source region 73 and a drain region 74 are formed nearby the surface of the semiconductor substrate 70 between the gate electrode 72 and the isolation region 71. The gate electrode 72 is formed on a gate oxide film 75 formed on the surface of the semiconductor substrate 70. The gate electrode 72 has an $n^+$ type polycrystalline silicon layer 76, a stacked layer 77 of a tungsten (W) layer and a tungsten nitride (WN) layer, and a cap insulating film 78. A gate sidewall 79 is formed on the side face of the gate electrode 72. An interlayer dielectric film 80 is formed on the semiconductor substrate 70. Contact plugs 83 and 84 are formed in the interlayer dielectric film 80. A source contact plug 83 connects with a source region 73. A drain contact plug 84 connects with a drain region 74.

Distances X between the source contact plug 83 and the isolation region 71 is necessary. Distances X between the drain contact plug 84 and the isolation region 71 are necessary. An appropriate value for the distance X is decided by considering a misalignment value of a mask and dimensional fluctuations of a contact diameter. The distance X required is approximately 100 nm or more. Therefore, the distance X prevents a semiconductor device from becoming more highly densified.

If the distance X is not sufficient, the source contact plug 83 contacts with the isolation region 71 as shown in FIG. 2. In this case, the contact plug 83 may contact with the semiconductor substrate 70 below the source region 73. The semiconductor substrate 70 and the source region 73 would short-circuit. An MOS transistor would not operate normally. Short circuit failure may also occur in the drain region 74. Short circuit failure may also occur in both the source region 73 and drain region 74.

SUMMARY OF THE INVENTION

A semiconductor device according to embodiments of the present invention includes:

an isolation region which is embedded in a semiconductor substrate and isolates the surface of the semiconductor substrate and whose upper-face height is substantially equal to the height of the surface of the semiconductor substrate;

a semiconductor active region including the surface of the semiconductor substrate and formed below the surface;

a gate insulating film formed on the active region;

a gate electrode which is formed on the gate insulating film and set on or over the isolation region, whose first side face is set on or over the isolation region, whose second side face is set over the active region and crosses over the active region, and the entire surface of whose lower face is substantially flat;

a field insulator which is set on the isolation region, whose first side face contacts with a first side face of the gate electrode, and whose second side face is continuous with a face formed by extending a side face of the isolation region;

a sidewall insulator having a sidewall contacting with the second side face of the field insulator and the second side face of the gate electrode; and a contact electrode set on the active region.

BRIEF DESCRIPTION OF THE DRAWINGS

FIG. 3B is a sectional view of the semiconductor device of the first embodiment, in which FIG. 3B shows a sectional view in the direction B—B in FIG. 3A;

FIG. 3C is a sectional view of the semiconductor device of the first embodiment, in which FIG. 3C shows a sectional view in the direction C—C in FIG. 3A;

FIG. 5A to FIG. 17 are sectional views of the semiconductor device of the first embodiment during fabrication;

FIGS. 5A, 6A, 7A, 8A, 9A, 10A, 11A, 12A, 13A, 14, 15, 16A, and 17 are sectional views in the direction B—B in FIG. 3A;

FIG. 18B is a sectional view of the semiconductor device of the second embodiment, in which FIG. 18B shows a sectional view in the direction B—B of FIG. 18A;

FIG. 18C is a sectional view of the semiconductor device of the second embodiment, in which FIG. 18C shows a sectional view in the direction C—C of FIG. 18A;

FIG. 19B is a sectional view of the semiconductor of the third embodiment, in which FIG. 19B shows a sectional view in the direction B—B in FIG. 19A;

FIG. 19C is a sectional view of the semiconductor of the third embodiment, in which FIG. 19C shows a sectional view in the direction C—C of FIG. 19A;

FIG. 20A to FIG. 23 are sectional views of the semiconductor device of the third embodiment during fabrication;

FIGS. 20A, 21A, 22, and 23 are sectional views in the direction B—B in FIG. 19A;

DETAILED DESCRIPTION OF EMBODIMENTS

Figure 1:
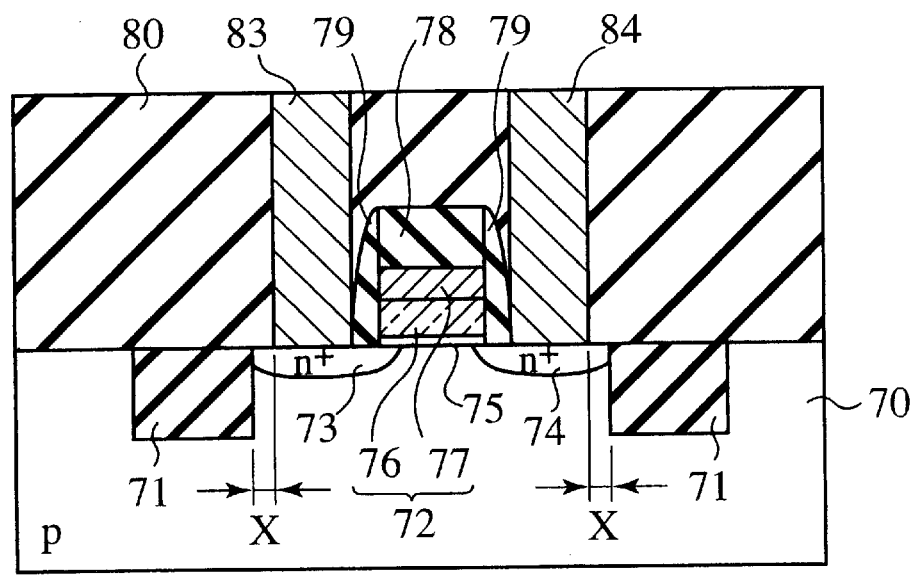
FIG. 1 and FIG. 2 are sectional views of an earlier semiconductor device.
Figure 2:
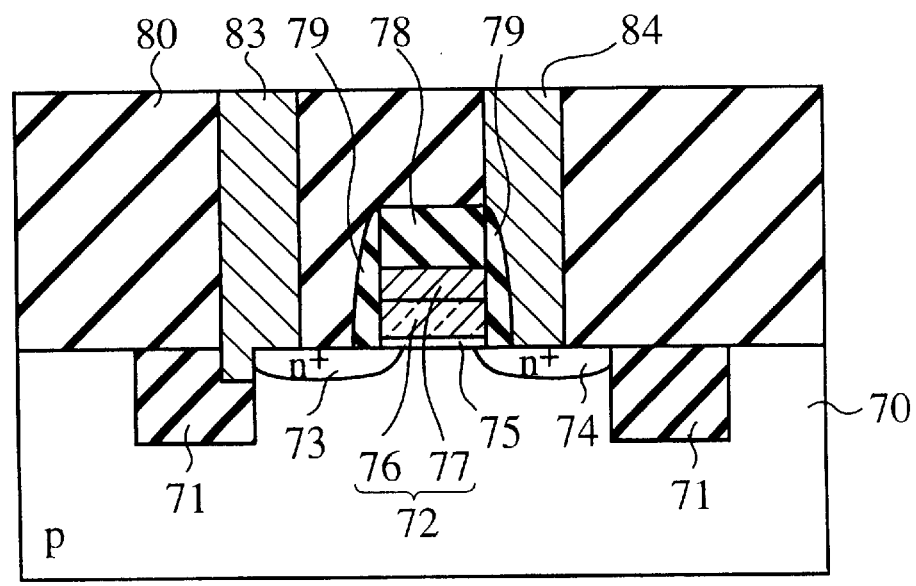

Various embodiments of the present invention will be described with reference to the accompanying drawings. It is to be noted that the same or similar reference numerals are applied to the same or similar parts and elements throughout the drawings, and description of the same or similar parts and elements will be omitted or simplified.

(First Embodiment)

Figure 3A:
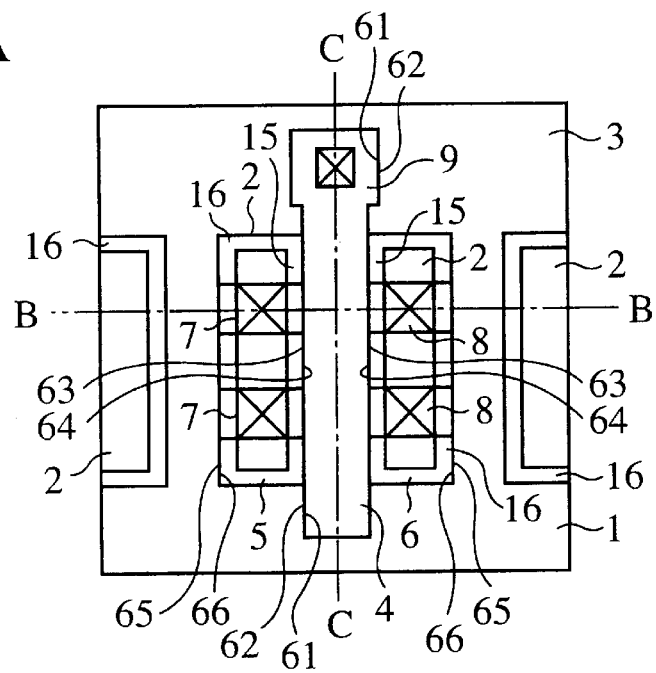
FIG. 3A is a top view of a semiconductor device of first embodiment.
Figure 3B:
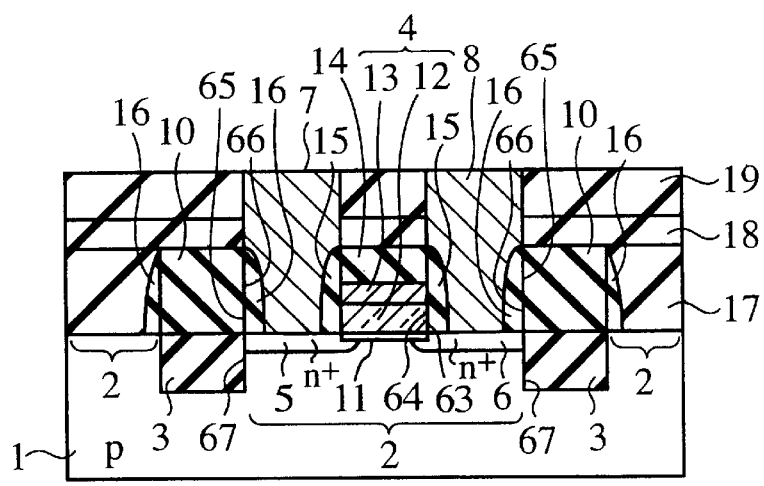
Figure 3C:
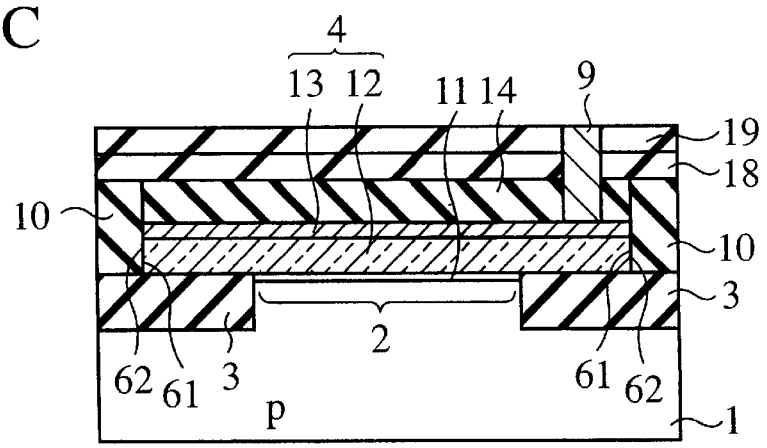

As shown in FIGS. 3A to 3C, the semiconductor device of the first embodiment has an isolation region 3 embedded in a semiconductor substrate 1. The isolation region 3 isolates the surface of the semiconductor substrate 1 from other surfaces of the semiconductor substrate 1. The height of the upper face of the isolation region 3 is equal to the height of the surface of the semiconductor substrate 1. The upper face of the isolation region 3 is continuous with a plane including the surface of the semiconductor substrate 1. The isolation region 3 mainly made of silicon dioxide.

An active region 2 is formed at the surface of and in the semiconductor substrate 1. The active region 2 is a semiconductor region surrounded by the isolation region 3. A source region 5 and a drain region 6 are formed at the surface of and in the active region 2. Side faces of the source region 5 and drain region 6 contact with the side face 67 of the isolation region 3.

A gate insulating film 11 is disposed on the active region 2 between the source region 5 and a drain region 6. A gate electrode 4 is disposed on the gate insulating film 11. The gate electrode 4 has a plurality of layers 12 and 13. The gate electrode 4 has an n$^+$ type polycrystalline silicon layer 12 and a composite layer 13 encompassing a tungsten (W) layer and a tungsten nitride (WN) layer. The gate electrode 4 is set on or over the isolation region 3. The first side face 61 of the gate electrode 4 is set on or over the isolation region 3. The second side face 64 of the gate electrode 4 is set over the active region 2. The gate electrode 4 extends along the direction of the second side face 64 so as to cross the active region 2. The gate electrode 4 covers up to either end of the active region 2 in one direction on the active region 2. The gate electrode 4 divides the active region 2 into the source region 5 and the drain region 6.

The entire lower face of the gate electrode 4 is substantially planar. The width of the gate electrode 4 is constant over the active region 2. The height of the upper face of the gate electrode 4 is constant.

A field insulator 10 is provided on the isolation region 3. The first side face 62 of the field insulator 10 contacts with the first side face 61 of the gate electrode 4. The second side face 65 of the field insulator 10 is continuous with a face formed by extending the side face 67 of the isolation region 3. The field insulator 10 mainly made of silicon nitride. The field insulator 10 is disposed on the upper face of the isolation region 3 in self-alignment topology with the isolation region 3.

Isolation-sidewall insulators 16 contact to the second side faces 65 of the field insulator 10. Gate-sidewall insulators 15 are formed at the second side faces 64 of the gate electrode 4 so as to contact with the second side faces 64. The gate-sidewall insulators 15 and the isolation-sidewall insulators 16 mainly made of silicon nitride.

Contact electrodes 7 and 8 contact with the gate-sidewall insulators 15 and the isolation-sidewall insulators 16. The contact electrodes 7 and 8 are formed on the active region 2. The contact electrodes 7 and 8 are formed between the gate-sidewall insulators 15 and the isolation-sidewall insulators 16 in self-alignment topology, respectively.

A cap insulating film 14 is disposed on the gate electrode 4. The side face of the cap insulating film 14 contacts the first side face 62 of the field insulator 10. The side face of the cap insulating film 14 contacts with side faces 63 of the gate-sidewall insulators 15 and the isolation-sidewall insulators 16. The cap insulating film 14 is formed using the same substance as the field insulator 10. The cap insulating film 14 mainly made of silicon nitride.

A first interlevel insulating film 17, a second interlevel insulating film 18 and a third interlevel insulating film 19 are disposed on the semiconductor substrate 1. The first interlevel insulating film 17, the second interlevel insulating film 18 and the third interlevel insulating film 19 have etching rates larger than those of the sidewall insulators 15 and 16. The first interlevel insulating film 17, the second interlevel insulating film 18 and the third interlevel insulating film 19 mainly contain silicon dioxide.

In the case of the semiconductor device of the first embodiment, the isolation region 3 is embedded in the semiconductor substrate 1, forming the STI structure.

The gate electrode 4 crosses over the active region 2. The end of the gate electrode 4 is formed on the isolation region 3. The active region 2 is isolated into two regions by the gate electrode 4. The one region of the active region 2 serves as the source region 5. The other region of the active region 2 serves as the drain region 6. A channel is formed nearby the surface of the semiconductor substrate 1 below the gate electrode 4. A MOS transistor is implemented in the active region 2.

Two source contact plugs 7 are formed on the source region 5 between the gate-sidewall insulators 15 and the isolation-sidewall insulators 16. Two drain contact plugs 8 are formed on the drain region 6 between the gate-sidewall insulators 15 and the isolation-sidewall insulators 16. It is possible to form one or more contact plugs on the source region 5 and drain region 6 by considering the contact diameter, the necessary contact resistance value and the areas of the source region 6 and drain region 6.

The gate oxide film 11 is directly formed on the surface of the semiconductor substrate 1. The polycrystalline silicon layer 12 is formed on the gate oxide film 11. The composite layer 13 is formed on the polycrystalline silicon layer 12. The cap insulating film 14 is formed on the composite layer 13. A gate contact plug 9 penetrates the third interlevel insulating film 19, the second interlevel insulating film 18 and the cap insulating film 14 so as to contact with one end of the gate electrode 4 and connected to an upper wiring layer or the like.

A first Boro-Phosphate-Silicate Glass (BPSG) film 17 is formed on the semiconductor substrate 1 as the first interlevel insulating film. A second BPSG film 18 is formed on the first interlevel insulating film 17 as the second interlevel insulating film. Surfaces of the first interlevel insulating film 17 and the second interlevel insulating film 18 are flattened. A tetraehtylorthosilicate Glass (TEOS) film 19 is formed on the second BPSG film 18 as the third interlevel insulating film.

A contact hole is formed in the first BPSG film 17, second BPSG film 18, and TEOS film 19 formed on the semiconductor substrate 1 respectively. Tungsten or the like is embedded in the contact hole. A tungsten source contact plug 7 connects with the source region 5. A drain contact plug 8 connects with the drain region 8.

The depth of a trench in which the insulator 3 is embedded is approximately 300 nm. The insulator uses a film mainly made of silicon dioxide. The gate electrode 4 is formed on the semiconductor substrate 1 surrounded by the isolation region 3.

The field insulator 10 is formed by self-alignment method with the isolation region 3 and mainly made of silicon nitride, formed directly on the isolation region 3. The height of the upper face of the field insulator 10 is equal to the height of the upper face of the cap insulating film 14 on the gate electrode 4. The width of the field insulator 10 is equal to the width of the isolation region 3. The height of the gate electrode 4 is approximately 350 nm or more. The gate-sidewall insulator 15 is made of a silicon nitride film or the like at a thickness of approximately 30 nm. In this case, the gate insulating film 11 is made of a silicon oxide film or a silicon nitride-oxide film having a thickness of approximately 0.3 to 10 nm. The isolation-sidewall insulator 16 having the same composition and the same thickness as the gate-sidewall insulator 15 is formed on the surface of the silicon nitride film 10 on the isolation region 3.

The polycrystalline silicon layer 12 is formed at a thickness of approximately 80 nm. The composite layer 13 encompassing the tungsten layer and the tungsten nitride layer is formed at a thickness of approximately 50 nm. It is possible to form a gate electrode without using the composite layer 13. The cap insulating film 14 uses a silicon nitride or the like. The cap insulating film 14 is formed at a thickness of approximately 200 nm.

A barrier metal is stacked in the contact hole by a composite film of a titanium (Ti) film and a titanium nitride (TiN) film or the like having a thickness of approximately 30 to 40 nm. Tungsten is embedded in the contact hole on the surface of the barrier metal.

Both ends of the gate electrode 4 are formed on the isolation region 3. The side faces 61 of the gate electrode 4 are covered with the silicon nitride film 10. The gate contact plug 9 is connected to one end of the gate electrode 4. The gate electrode 4 can be connected to other wiring. The gate electrode 4 extends from the active region 2 to the isolation region 3.

Moreover, the gate electrode 4 has the same thickness even on the isolation region 3 and the active region 2. The lower face and upper face of the gate electrode 4 are flattened and therefore, it is possible to obtain a MOS transistor of high versatility.

Furthermore, the isolation region 3 does not protrude from the surface of the semiconductor substrate 1. The upper surface of the isolation region 3 is continuous with the plane of the upper surface of the semiconductor substrate 1.

Figure 4:
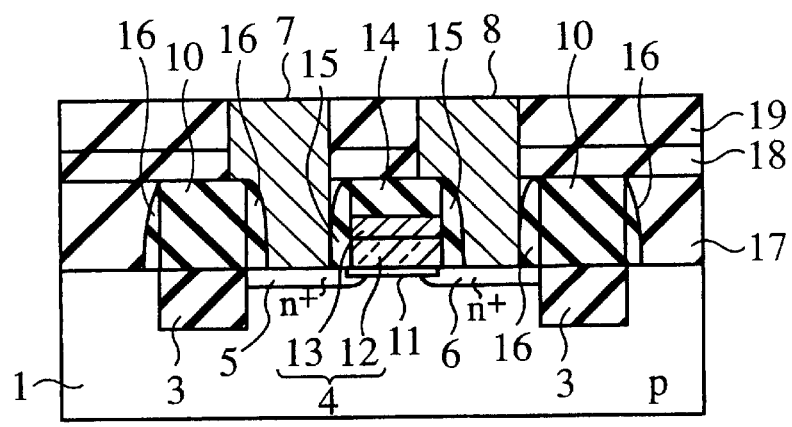
FIG. 4 is an illustration for explaining the effect of the semiconductor device of the first embodiment.

From these facts, as shown in FIG. 4, it is possible to form the contact plugs 7 and 8 on the transistor gate 4 and isolation region 3 in self-aligning manner. Moreover, the contact plug 7 dose not contact with the isolation region 3 and the semiconductor substrate 1 below the source region 5 if dimensional fluctuation or misalignment in a photolithography process occurs. It is unnecessary to adopt the distance X in FIG. 1 between the contact plug 83 and the isolation region 71 or the contact plug 84 and the isolation region 71. Moreover, because film thickness of the gate-sidewall insulators 15 and the isolation-sidewall insulators 16 is approximately 30 nm, it is possible to make the thickness less than the distance X. It is possible both to dielectrically isolate active regions from each other and to provide a highly integrated and highly densified semiconductor.

Moreover, because the isolation region 3 dose not protrude from the semiconductor substrate 1, it is also possible to form the gate electrode 4 on the isolation region 3 with no step. By flattening the upper surface of the gate electrode 4 and making the thickness of the gate electrode 4 uniform, it is possible to maintain the uniformity of electric field distribution even at different positions of the gate electrode 4.

Moreover, because the isolation region 3 and the silicon nitride film 10 on the region 3 are formed in self-aligning manner, misalignment does not occur. Therefore, high integration is realized because an alignment margin for forming a contact plug is unnecessary.

In this case, it is also allowable for a well having a conductivity type opposite to that of the semiconductor substrate 1 to be formed near to the surface of the semiconductor substrate 1.

Next, a fabrication method of the semiconductor device of the first embodiment will be described below.

Figure 5A:
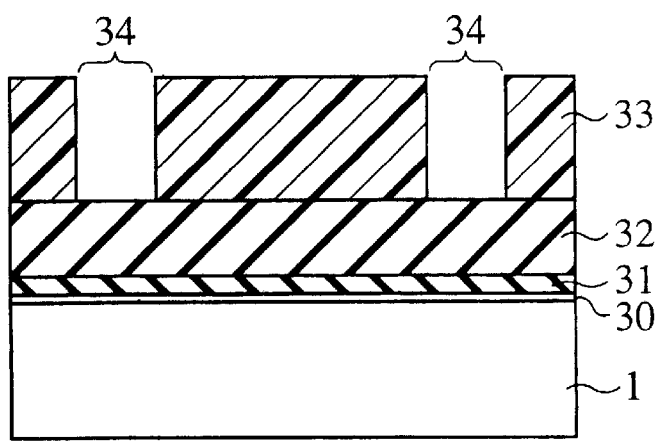
Figure 5B:
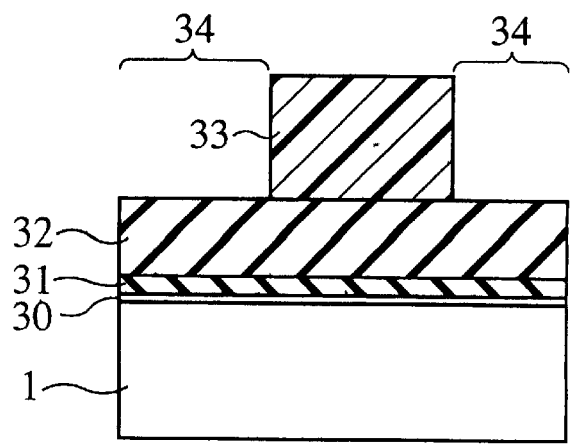
FIGS. 5B, 6B, 7B, 8B, 9B, 10B, 11B, 12B, 13B, and 16B are sectional views in the direction C—C in FIG. 3A.
Figure 6A:
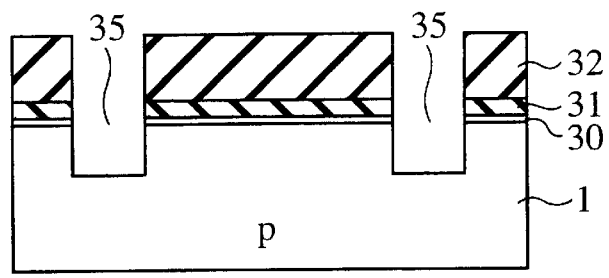
Figure 6B:
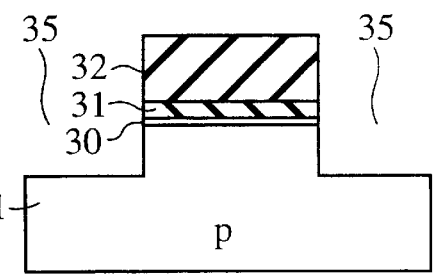
Figure 7A:
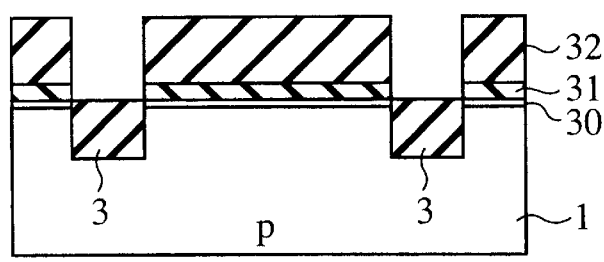
Figure 7B:
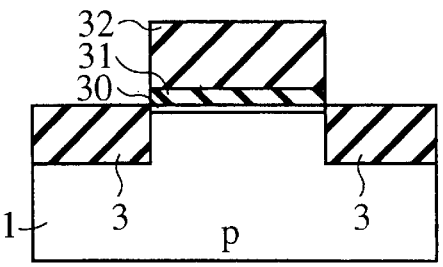

(a) First, a thermal oxide film 30, a silicon nitride film 31, and an insulating film 32 are formed in order on the first-conductivity-type semiconductor substrate 1 made of silicon. The thermal oxide film 30, silicon nitride film 31, and insulating film 32 are formed so that the total thickness of these films becomes approximately 350 nm or more. It is necessary to make the total thickness of these films almost equal to the height including a cap insulating film 14 to be formed in the subsequent process. Then, as shown in FIGS. 5A and 5B, a resist 33 is coated on the insulating film 32 and an opening 34 is delineated in the resist 33 at a region where an isolation region 3 will be formed through photolithography. In this case, it is necessary that the insulating film 32 is not silicon nitride film but oxide film in order to take a high selective ratio of a selective etching to a silicon nitride film to be formed in a subsequent process. Then, the three layers 32, 31, and 30 are etched up to the semiconductor substrate 1 through reactive ion etching (RIE) using the resist as an etching mask. The resist 33 is removed. Then, as shown in FIGS. 6A and 6B, the semiconductor substrate 1 is etched up to a desired depth through RIE by using the silicon nitride film 31 and insulating film 32 as masks to form a trench 35 serving as the isolation region 3. The depth of the trench 35 is approximately 300 nm.

(b) Then, the inside of the trench 35 is filled with a isolation insulator 3. That is, an oxide film 3 is embedded in the trench 35.

(c) Then, the upper face of the embedded isolation insulator 5 is made equal to the height of the surface of the semiconductor substrate 1. The oxide film 3 is etched up to about the same height as the surface of the semiconductor substrate 1 through chemical mechanical polishing (CMP), wet etching, and RIE. An isolation region 3 is formed in the semiconductor substrate 1.

Figure 8A:
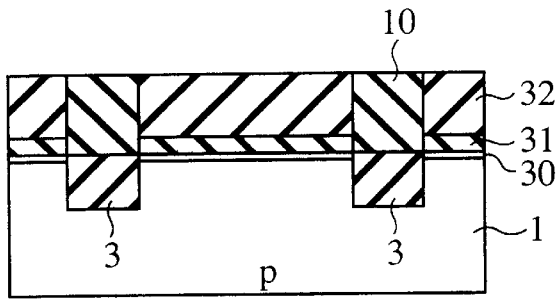
Figure 8B:
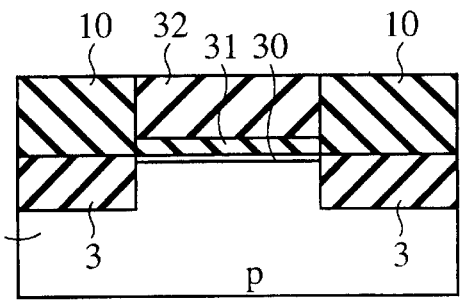

(d) Then, silicon nitride 10 is deposited on the isolation region 3. Next, the silicon nitride film 10 is etched up to the height of the insulating film 32 through RIE, using the insulating film 32 as a stopper. And as shown in FIGS. 8A and 8B, a field insulator 10 is buried in the openings 35 defined by the etching masks 31 and 32 on the isolation insulator 3.

(e) A resist 36 is coated on the insulating film 32. Patterning is performed through photolithography process.

Figure 9A:
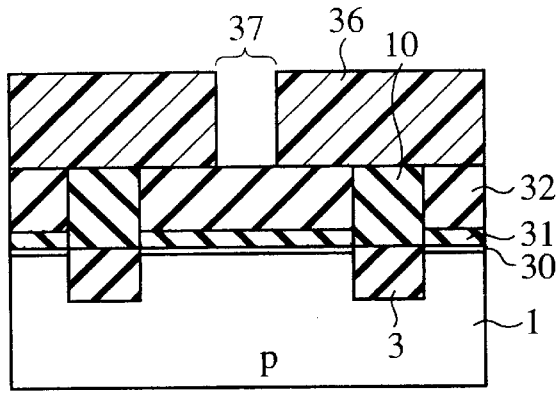
Figure 9B:
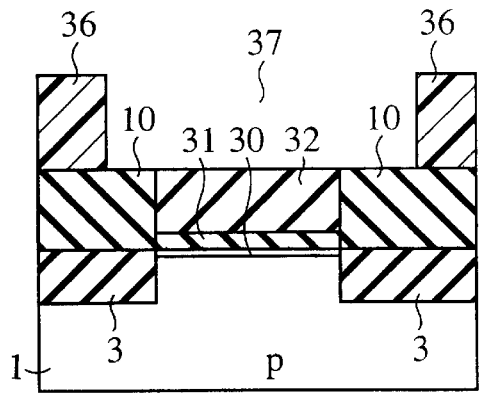
Figure 10A:
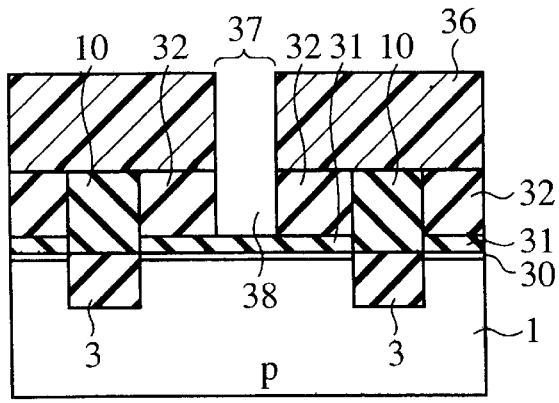
Figure 10B:
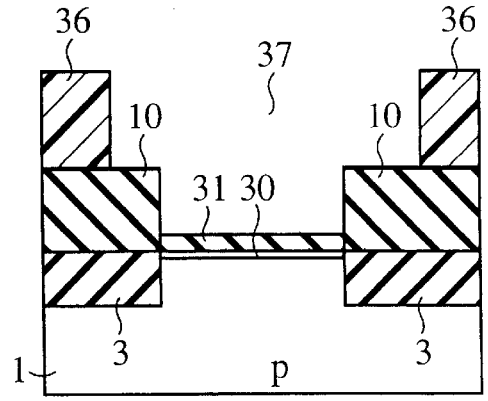
Figure 11A:
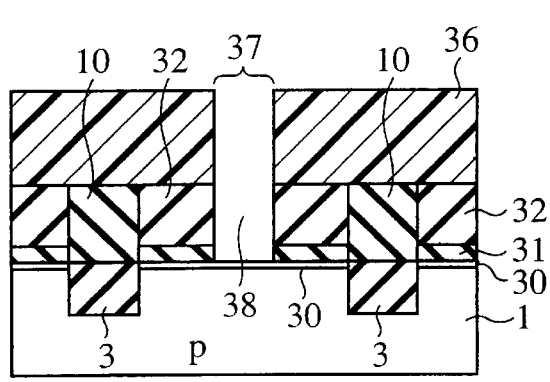
Figure 11B:
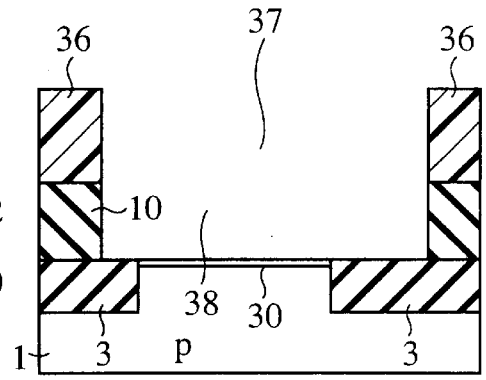
Figure 12A:
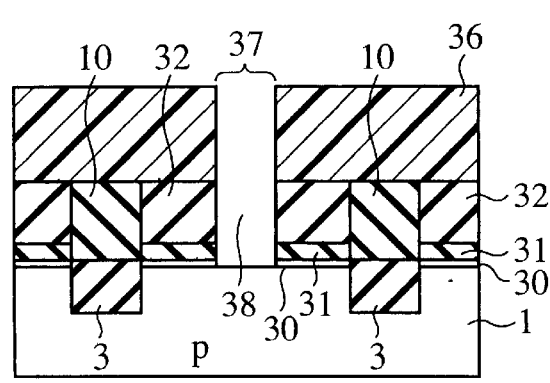
Figure 12B:
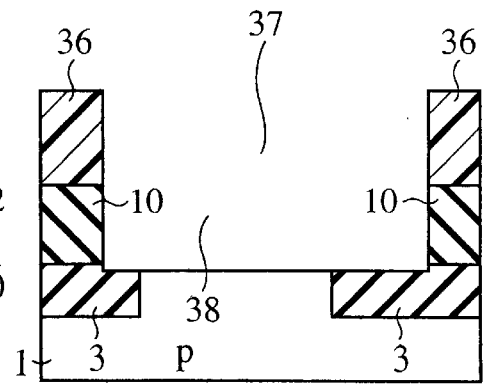

As shown in FIGS. 9A and 9B, an opening 37 is formed in the resist 36. The opening 37 is formed over the position of a gate electrode 4 to be formed in a subsequent process. Then, as shown in FIGS. 10A and 10B, the insulating film 32 below the opening 37 formed on the resist 36 is etched through RIE. The etching is stopped at the field insulator 10 and the silicon nitride film 31. The etching rate of the silicon oxide film 32 is higher than that of a silicon nitride film 31. An opening 38 is formed. Then, as shown in FIGS. 11A and 11B, the silicon nitride film 31 below the opening 37 is etched through RIE. The etching is stopped at the isolation region 3 and film 30. The etching rate of a silicon nitride film 31 is higher than that of a silicon oxide film 30. The silicon nitride film 10 on the isolation region 3 is partially removed. Thereby, the bottom face of the opening 38 is flattened. Then, as shown in FIGS. 12A and 12B, the isolation region 3 and film 30 below the opening 37 are wet-etched. The resist 36 is removed.

(f) Next, a sacrificed oxidation film is formed on the surface of the semiconductor substrate 1. To obtain a desired transistor threshold, first-conductivity type impurity ions are ion-implanted. The sacrificed oxidation film is removed. Then, a gate oxide film 11 is formed through thermal oxidation. The gate oxide film 11 has a thickness of approximately 0.3 to 10 nm.

(g) Then, polycrystalline silicon 12 doped with phosphorus is deposited on the entire surfaces of the gate oxide film 11, field insulator 10, and insulating film 32. The polycrystalline silicon 12 is etched through CMP, RIE, and wet etching until the film thickness reaches to a designed value such as approximately 80 nm in the opening 38. Then, a composite layer 13 of a tungsten layer and a tungsten nitride layer is deposited on the entire surfaces of the polycrystalline silicon layer 12, field insulator 10, and insulating film 32. The stacked layer 13 is etched through method such as CMP, RIE, and wet etching until the film thickness reaches to a designed value such as approximately 50 nm in the opening 38. The gate electrode 4 can be formed without using the composite layer 13. However, when a gate width is small, it is preferable to use tungsten for a gate electrode because the resistance of the gate electrode 4 is decreased. In this case, it is also possible to use a metallic silicide layer made of tungsten silicide for the gate electrode 4 instead of a stacked layer.

Figure 13A:
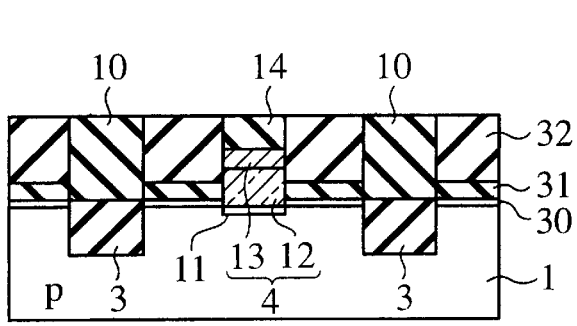
Figure 13B:
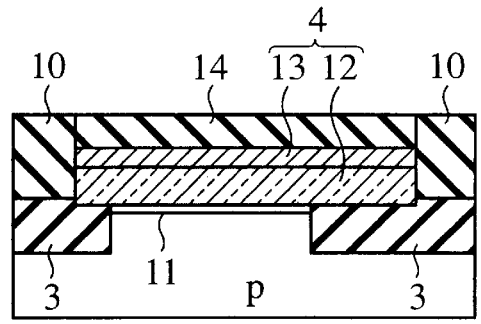

(h) Then, silicon nitride 14 is deposited on the entire surfaces of the composite layer 13, field insulator 10, and insulating film 32. The silicon nitride 14 is etched through method such as CMP, RIE, and wet etching until the film thickness reaches a designed thickness such as approximately 200 nm in the opening 38. The upper face of the silicon nitride 14 is planarlized such that the heights of the upper faces of the field insulator 10 becomes same as the insulating film 32. As a result, shown in FIGS. 13A and 13B, a cap insulating film 14 is formed. And, layers 12 to 14 are embedded in the opening 38 of the insulating film 32 to form the gate electrode 4.

Figure 14:
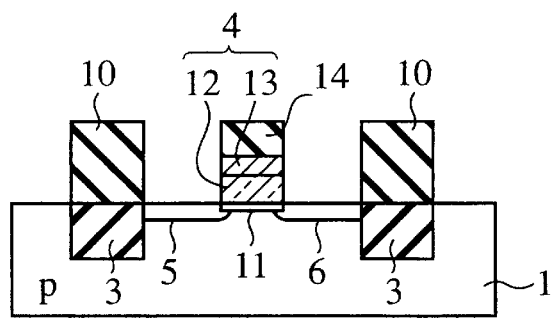

(i) As shown in FIG. 14, the insulating film 32, the silicon nitride film 31, and the thermal oxide film 30 are removed from both sides of the silicon nitride film 10 and both sides of the gate electrode 4 on the isolation region 3. To form a source region 5 and a drain region 6, a sacrificed oxidation film is formed on the silicon substrate 1. Second-conductivity-type impurity ions are ion-implanted into the silicon substrate 1 so as to form the source region 5 and the drain region 6.

In this case, when removing the thermal oxide film 30, silicon nitride film 31, and insulating film 32 made of a BPSG film, the surfaces of the silicon nitride films 10 and the cap insulating film 14 are also slightly removed. This is because the silicon nitride films 31, the field insulator 10 and the cap insulating film 14 are respectively formed by a silicon nitride film.

Figure 15:
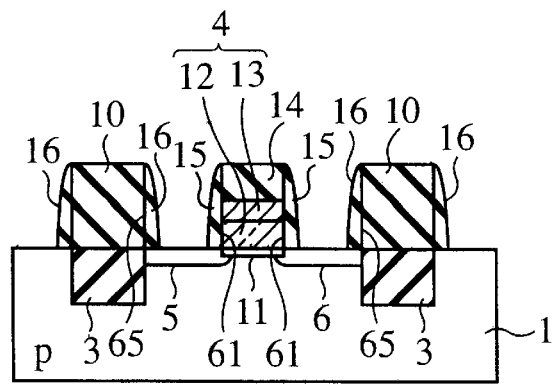

(j) Then, a silicon nitride film 16 is formed on the side face 65 and upper face of the silicon nitride film 10 on the isolation region 3. At the same time, a silicon nitride film 15 is formed on the side face 61 and the upper face of the gate electrode 4. In this case, an insulating film of a silicon nitride film 15 and 16 is formed at a thickness of approximately 30 nm. In this process, a silicon nitride film 15 and 16 is deposited on the entire surface of a semiconductor substrate 1. As shown in FIG. 15, the silicon nitride film 15 and 16 is etched back. The silicon nitride films 15 and 16 are removed from the surfaces of the silicon nitride film 10 and gate electrode 4. The silicon nitride films 15 and 16 formed on the side face 65 of the silicon nitride film 10 and the side face 61 of the gate electrode 4 are left.

(k) A first BPSG film 17 is deposited as a layer insulating film and a second BPSG layer 18 is deposited on the film 17 in order, and they are flattened. Then, an oxide film such as a TEOS film 19 is deposited on the second BPSG layer 18. In this case, because they require etching, the first BPSG film 18, the second BPSG film 18, and the TEOS film 19 must respectively have etching rates larger than that of the gate-sidewall insulator 15 or the isolation-sidewall insulator 16 made of the silicon nitride film 10 on the isolation region 3. For example, it is preferable to use a material having an etching rate 10 times more or larger than the etching rate of a silicon nitride film.

Figure 16A:
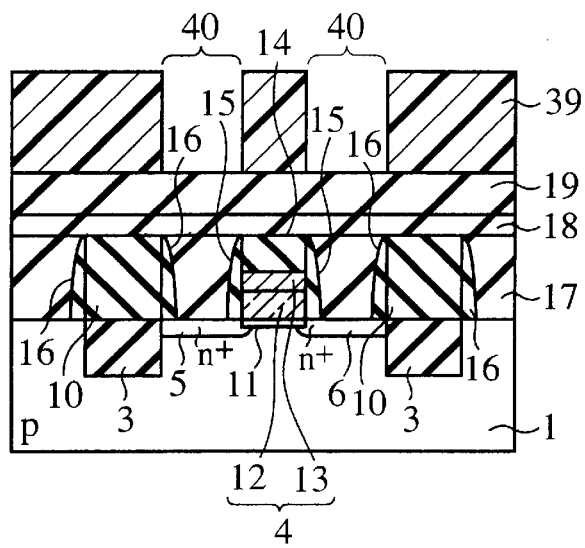
Figure 16B:
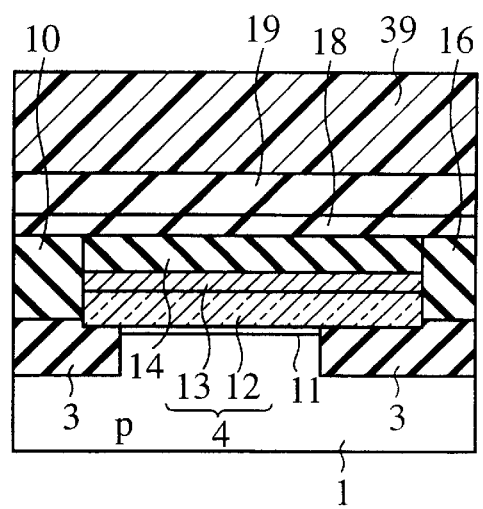
Figure 17:
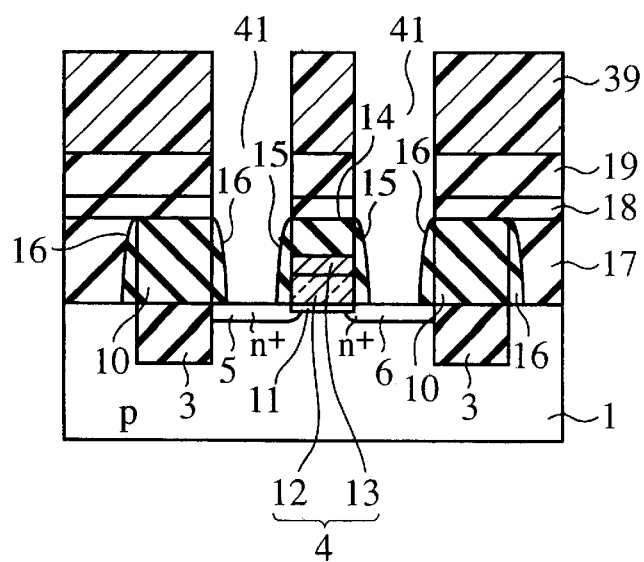

(l) A resist 39 is formed on the entire surface. As shown in FIGS. 16A and 16B, the resist 39 is patterned so as to form an opening 40. Then, as shown in FIG. 17, the first BPSG film 17, the second BPSG layer 18, and the TEOS film 19 below the opening 40 of the resist 39 are etched off through RIE to expose a part of the surface of the semiconductor substrate 1. A contact hole 41 is formed below the opening 40 of the resist 39. And the resist 39 is removed.

(m) A barrier metal is formed on the contact hole 41. The barrier metal is titanium or the like. The film thickness of the barrier metal ranges between approximately 30 and 40 nm. Then, the contact hole 41 is filled with tungsten. Tungsten is deposited on the entire surface of the TEOS film 19. CMP of the tungsten is executed using the TEOS film 19 as a stopper, so as to expose the surface of the TEOS film 19. As a result, as shown in FIG. 3B, the source contact plug 7 and drain contact plug 8 are formed, and the semiconductor devise of the first embodiment is finished.

When opening the contact holes 7 and 8 on the source region 5 and drain region 6, the BPSG films 17 and 18 and the cap insulating film 14 are etched through RIE at a high selection ratio. A stable self-aligning contact can be formed. Therefore, by opening a slightly large contact hole 41, the contact area between a contact and an active region is not decreased even if mask alignment has not been correctly performed. A contact resistance can be stably lowered.

Because the isolation region 3 and the silicon nitride film 10 are formed using the same opening 35 of the same insulating film 32, the region 3 and the film 10 are formed in a self-aligning manner. Therefore, misalignment between the isolation region 3 and the silicon nitride film does not occur. Thereby, because it is unnecessary to provide an alignment margin for forming a contact, it is possible to fabricate a highly integrated semiconductor device.

It is possible to form the contact plugs 7 and 8, for both the transistor gate 4 and the isolation region 3 or for the isolation region 4, to the active region 2 in a self-aligning manner. Therefore, it is possible to prevent the contact plugs 7 and 8 from falling into the isolation region 3 due to misalignment or dimensional fluctuations in the photolithography. It is unnecessary to allow margins between the contact plugs 7 and 8 on one hand and the isolation region 3 on the other. Thus, it is possible to provide a highly integrated highly densified semiconductor device.

(Second Embodiment)

Figure 18A:
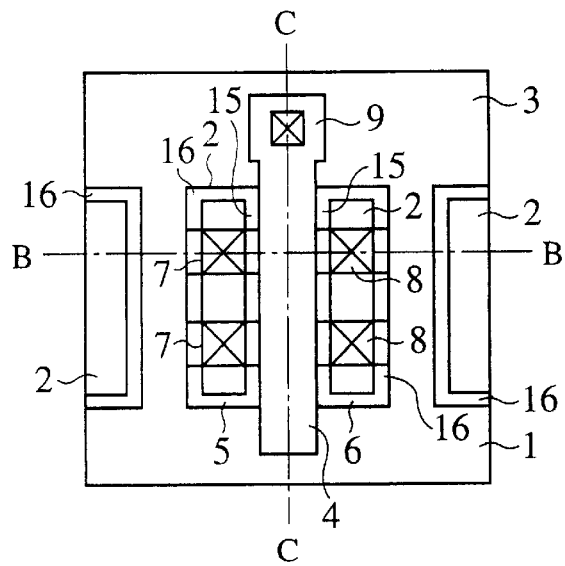
FIG. 18A is a top view of a semiconductor device of second embodiment.
Figure 18B:
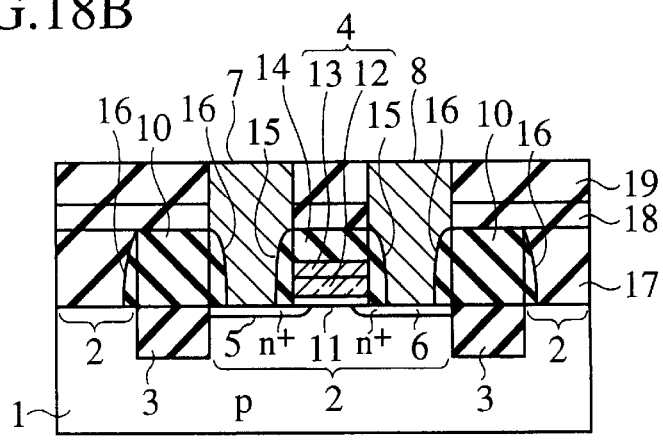
Figure 18C:
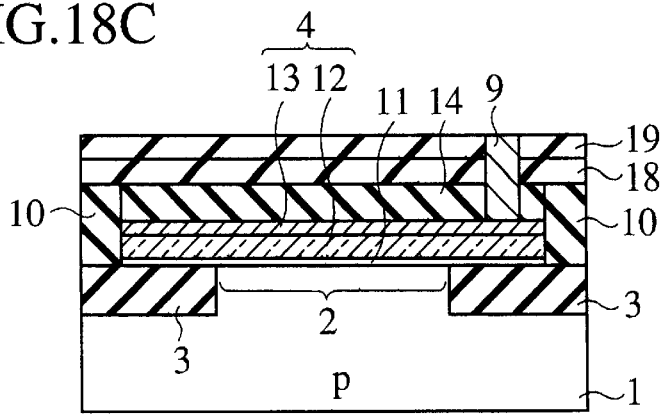

The semiconductor device of the second embodiment is different from the semiconductor device of the first embodiment in that a gate insulating film 11 is formed on an isolation region 3, as shown in FIG. 18C. In FIG. 12B, the semiconductor substrate 1 is thermally oxidized according to the first embodiment. Then, the gate insulating film 11 is formed. In the case of the second embodiment, it is possible to use a film deposited through CVD or sputtering for the gate insulating film 11. As a deposited film, a high-dielectric film can be used. As a high-dielectric material any one of barium strontium titanate (BST: $BaSrTiO_3$), strontium titanate ($SrTiO_3$), PLZT, and aluminum oxide ($AlO_3$) can be used. Thereby, it is possible to set the film thickness by converting the thickness of a silicon film into the thickness of the deposited oxide film, up to 0.5 nm. Thus, it is possible to realize the high-speed operation of a MOS transistor.

(Third Embodiment)

Figure 19A:
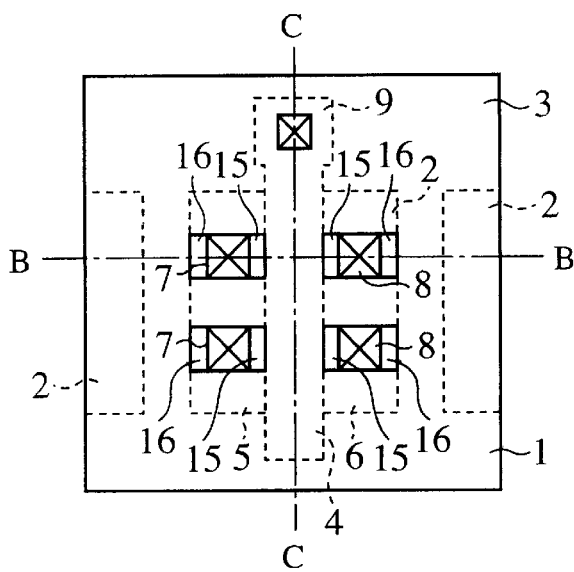
FIG. 19A is a top view of a semiconductor device of third embodiment.
Figure 19B:
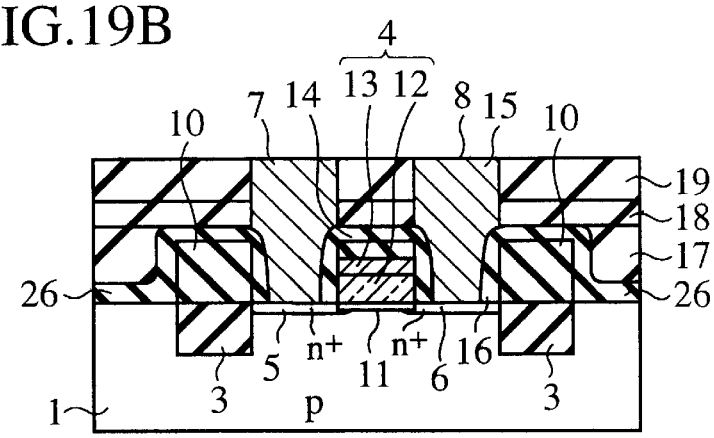
Figure 19C:
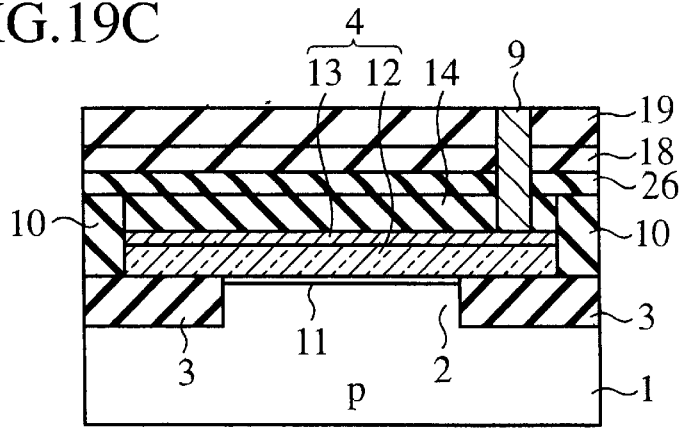

The semiconductor device of the third embodiment is different from the semiconductor device of the first embodiment in that a sidewall insulator 26 is formed on a field insulator 10 as shown in FIGS. 19A to 19C. Moreover, the former is different from the latter in that the sidewall insulator 26 is formed on a cap insulating film 14. Furthermore, the former is different from the latter in that the thickness of the sidewall insulator 26 on the surface of a semiconductor substrate 1 is almost equal to the thickness of a film formed on the field insulator 10. In the case of the semiconductor device of the third embodiment, the entire upper face of the silicon substrate 1 except the lower portions of contact plugs 7 and 8 is covered with a silicon nitride film. Thereby, it is possible to prevent metallic impurities in the wiring from diffusing into the semiconductor substrate 1.

Then, a fabrication method of the semiconductor device of the third embodiment is described below. In the case of the fabrication method of the semiconductor device of the third embodiment, items (a) to (h) and items (k) and (m) are the same.

Figure 20A:
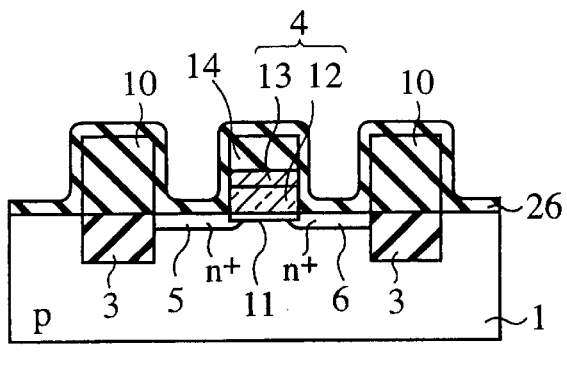
Figure 20B:
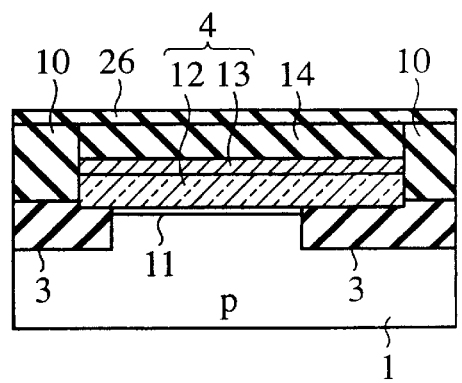
FIGS. 20B and 21B are sectional views in the direction C—C in FIG. 19A.

In item (i), the silicon nitride film 16 shown in FIG. 15 is not etched back. As shown in FIGS. 20A and 20B, the silicon nitride film 26 is formed on the side faces and upper faces of the silicon nitride film 10, gate electrode 4, and silicon substrate 1.

(l) an opening 41 for exposing the sidewall insulator 26 and an active region 2 is formed in the fourth insulating films 7 to 19 and the sidewall insulator 26.

Figure 21A:
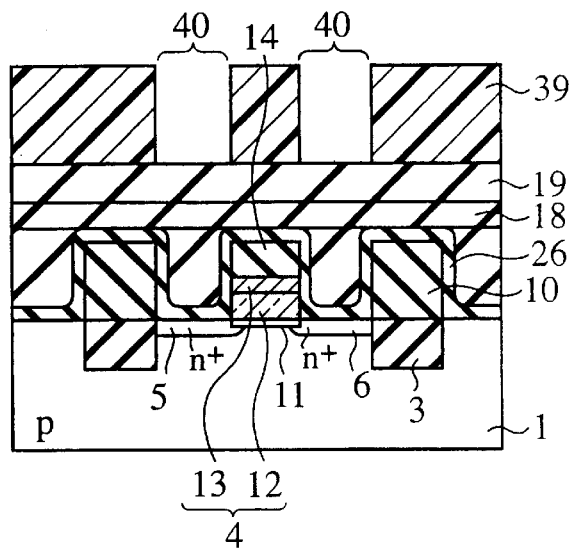
Figure 21B:
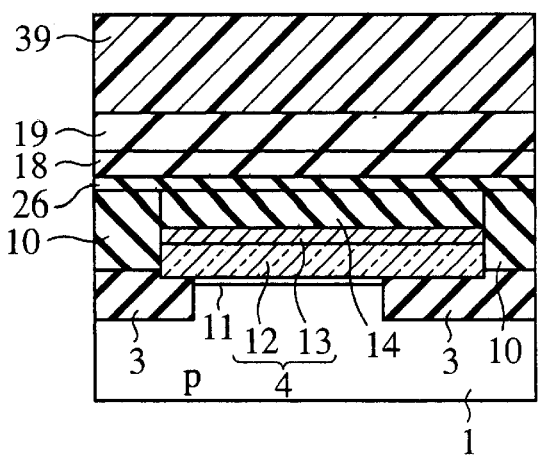

First, a resist 39 is formed on the entire surface. As shown in FIGS. 21A and 21B, patterning is performed through photolithography. An opening 40 is formed.

Figure 22:
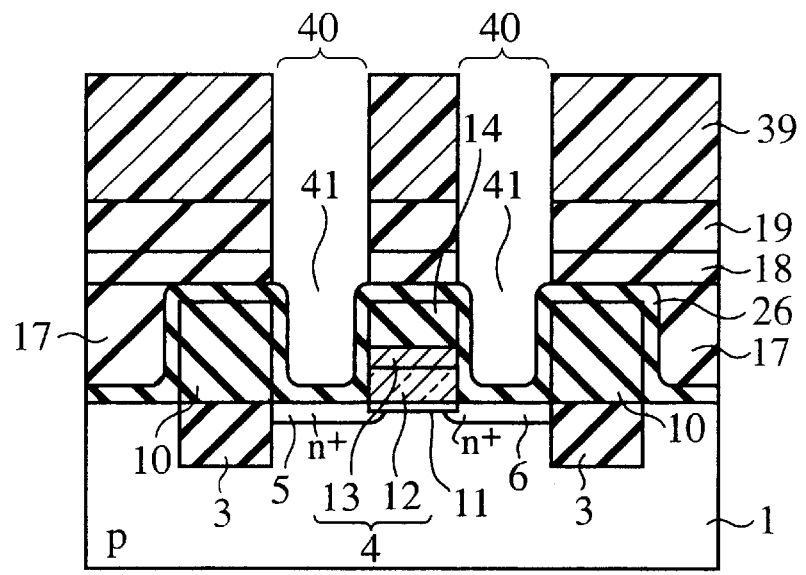
Figure 23:
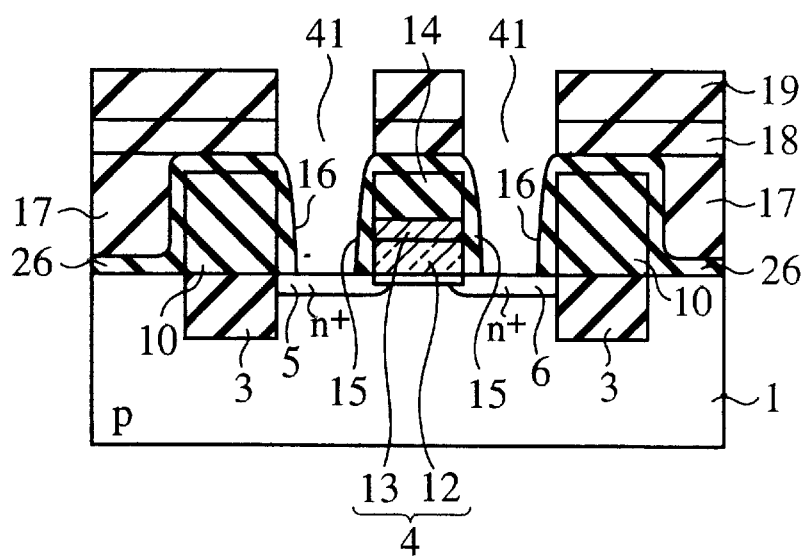

Then, as shown in FIG. 22, the first BPSG film 17, second BPSG layer 18, and TEOS film 19 below the openings 40 of the resist 39 are etched off through RIE. The sidewall insulator 26 is exposed. The resist 39 is removed. As shown in FIG. 23, the sidewall insulator 26 below the openings 41 of the first BPSG film 17, second BPSG layer 18, and TEOS film 19 is etched off through RIE. The semiconductor substrate 1 is exposed. A contact hole 41 is formed. When the semiconductor substrate 1 is exposed, the surface of the semiconductor substrate 1 is not easily contaminated because the resist 39 is not present.

(Fourth Embodiment)

For the semiconductor device of the fourth embodiment, a case is described in which a contact plug is formed on an active region 51 wherein no gate electrode is present. It is possible to exclude an alignment margin, as in the case of the semiconductor device of the first embodiment. Therefore, it is possible to make the active region 51 requiring a larger alignment margin small. It is therefore possible to highly integrate a semiconductor device.

Figure 24A:
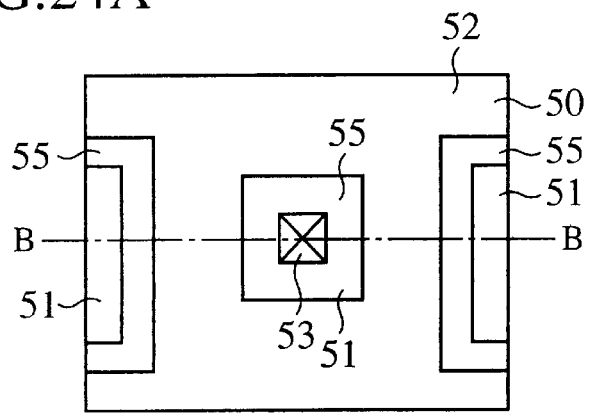
FIG. 24A is a top view of a semiconductor device of fourth embodiment.
Figure 24B:
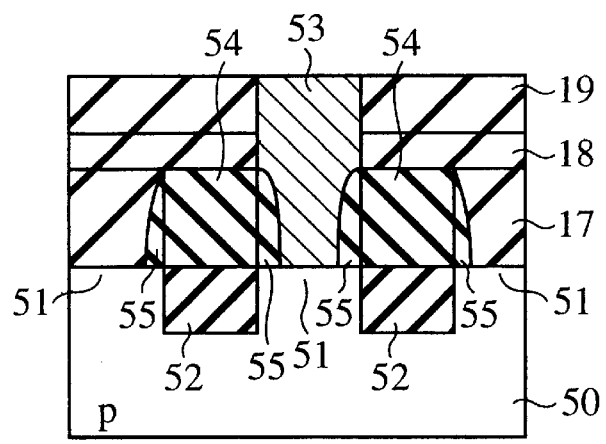
FIG. 24B is a sectional view of the semiconductor device of the fourth embodiment in the direction B—B in FIG. 24A.

As shown in FIGS. 24A and 24B, the semiconductor device of the fourth embodiment has an isolation region 52 embedded in a semiconductor substrate 50. The isolation region 52 isolates the surface of the semiconductor substrate 50. The height of the upper face of the isolation region 52 is substantially equal to the height of the surface of the semiconductor substrate 50. The upper face of the isolation region 52 is continuous with a plane that includes the surface of the semiconductor substrate 50. The isolation region 52 mainly contains silicon dioxide.

The active region 51 is formed below the surface of the semiconductor substrate 50 including the surface. The active region 51 is formed in the semiconductor substrate 50. The active region 51 is a semiconductor in which impurities are diffused.

A field insulator 54 is formed on the isolation region 52. The side face of the field insulator 54 is continuous with a plane obtained by extending the internal side face of the isolation region 52 on the entire circumference of the active region 51. The field insulator 54 mainly contains silicon nitride. The field insulator 54 is formed on the upper face of the isolation region 52 in self-alignment with the isolation region 52.

The external side face of a sidewall insulator 55 contacts with the internal side face of the field insulator 54. The sidewall of the sidewall insulator 55 is cylindrical. The sidewall insulator 55 mainly contains silicon nitride. The sidewall of the sidewall insulator 55 is formed on the side face of the field insulator 54 and also formed on the active region 51.

A contact electrode 53 contacts with the internal side face of the sidewall insulator 55 and is formed on the active region 51. The contact electrode 53 is formed on the sidewall of the sidewall insulator 55 in self-alignment.

Fourth insulating films 17 to 19 are formed on the field insulator 10. The fourth insulating films 17 to 19 have etching rates larger than those of the sidewall insulators 55. The fourth insulators 17 to 19 mainly contain silicon dioxide.

As shown in FIG. 24A, in the case of the semiconductor device of the fourth embodiment, the active region 51 into which impurities are implanted is formed in the semiconductor substrate 50. The second isolation region 52 is formed on the semiconductor substrate 50 so as to surround the active region 51. A contact plug 53 is formed at the central portion of the active region 51.

In FIG. 24A, the contact plug 53 is formed only on the central active region 51. In the case of a semiconductor device, however, many active regions 51 are formed and many contact electrodes 53 are formed at a plurality of necessary places. It is possible to form a plurality of contact plugs 53 on the active region 51 by considering a contact diameter, a necessary contact resistance value, and the area of the active region 51.

As shown in FIG. 24B, in the case of the semiconductor device of the fourth embodiment, the isolation region 52 is embedded in the semiconductor substrate 50 to form STI. The depth of the trench of the semiconductor substrate 50 in which an insulator is embedded is approximately 300 nm. The insulator uses a TEOS film or the like mainly containing silicon dioxide. The width of the trench is approximately 250 to 300 nm.

A silicon nitride film 54 formed in self alignment with the isolation region 52 and mainly containing silicon nitride is formed immediately on the isolation region 52 in self-alignment with the isolation region 52. The height of the silicon nitride film 54 is equal to the height of a gate electrode formed in other region and the width of the film 54 is equal to that of the isolation region 52.

Impurities are implanted into active region 51.

A sidewall insulating film 55 having the same composition and thickness as a gate-sidewall insulating film of a gate electrode to be formed on other portion is formed on the surface of the silicon nitride film 54 on the isolation region 52.

A first BPSG film 17 is formed on the semiconductor substrate 50 as a interlayer dielectric film and a second BPSG film 18 is formed on the film 17, and upper surfaces of the films 17 and 18 are flattened. A TEOS film 19 mainly containing silicon dioxide is formed on the second BPSG film 18.

A contact hole is formed in the first BPSG film 17, second BPSG film 18, and TEOS film 19. The contact plug 53 is connected with the active region 51 and formed in contact with the sidewall insulating film 55 of the silicon nitride film 54 on the isolation region 52.

Moreover, the isolation region 52 does not protrude beyond the semiconductor substrate 50 but its upper surface is continuous with the plane of the upper surface of the semiconductor substrate.

The fabrication method of the fourth embodiment is realized by executing a method almost the same as the fabrication method of the first embodiment. However, the forming a gate electrode in the first embodiment is not executed. One contact plug is formed between two isolation regions.

Figure 25:
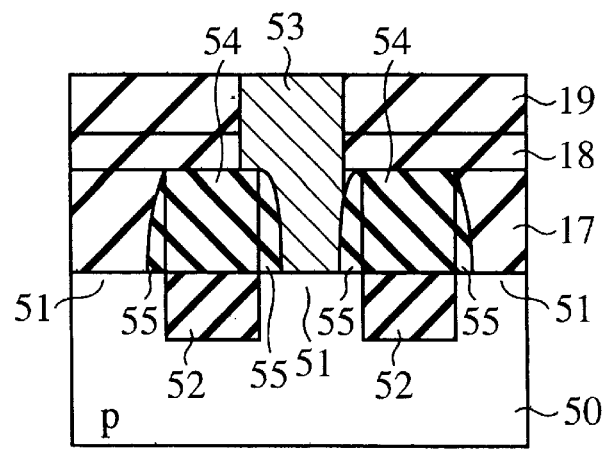
FIG. 25 is an illustration for explaining the effect of the semiconductor device of the fourth embodiment.

Thus, as shown in FIG. 25, it is possible to prevent the contact plug 53 falling into the isolation region 52 due to dimensional fluctuations or misalignment by forming the contact plug 53 in self-aligningment with the isolation region 52.

Moreover, because the isolation region 52 and the silicon nitride film 54 on the region 52 are formed in self-aligningment, no misalignment occurs. Therefore, it is unnecessary to allow an alignment margin for forming the contact plug 53.

It is thereby possible to reduce the area of the active region 51 and provide a highly integrated, highly densified semiconductor device.

In this case, it is also allowable that a well having a conductivity type opposite to that of the semiconductor substrate 50 is formed in the semiconductor substrate 50.

The present invention may be embodied in other specific forms without departing from the spirit or essential characteristics hereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced herein.

What is claimed is:

1. A semiconductor device comprising:

a semiconductor substrate;

an isolation region embedded in said semiconductor substrate, identified by an upper-face height having a substantially same height of a surface of said semiconductor substrate;

an active region formed at the surface of and in said semiconductor substrate;

a gate insulating film disposed on said active region;

a gate electrode disposed on said gate insulating film and over said isolation region, identified by first side faces disposed over said isolation region, second side faces disposed over said active region and a substantially flat lower face, the gate electrode extending along the second side faces so as to cross over said active region;

a field insulator disposed on said isolation region, identified by a first side face contacting with the first side face of said gate electrode and a second side face being continuous with a plane extending a side face of said isolation region;

an isolation-sidewall insulator contacting with the second side face of said field insulator;

a gate-sidewall insulator contacting with the second side face of said gate electrode; and a contact electrode formed on said active region.

2. The semiconductor device as claimed in claim 1, wherein the upper face of said isolation region is continuous with a plane including the surface of the semiconductor substrate.

3. The semiconductor device as claimed in claim 1, wherein a width of said gate electrode is constant at an upper portion of said active region.

4. The semiconductor device as claimed in claim 1, wherein a height of an upper face of said gate electrode is constant.

5. The semiconductor device as claimed in claim 1, wherein said gate insulating film is formed on said isolation region.

6. The semiconductor device as claimed in claim 1, wherein said sidewall insulator is formed on said field insulator.

7. The semiconductor device as claimed in claim 1, further comprising:

a cap insulating film formed on said gate electrode identified by side faces contacting with the first side face of said field insulator and said gate-sidewall insulator.

8. The semiconductor device as claimed in claim 7, wherein said gate-sidewall insulator is formed on said cap insulating film.

9. The semiconductor device as claimed in claim 7, wherein said cap insulating film is made of the same material as said field insulator.

10. The semiconductor device as claimed in claim 7, wherein said cap insulating film mainly contains silicon nitride.

11. The semiconductor device as claimed in claim 1, further comprising:

an interlevel insulating film disposed on said first insulating film, and having an etching rate larger than an etching rate of said gate-sidewall and isolation-sidewall insulators.

12. The semiconductor device as claimed in claim 11, wherein said interlevel insulating film mainly made of silicon dioxide.

13. The semiconductor device as claimed in claim 1, wherein said isolation region mainly made of silicon dioxide and said field insulator, said gate-sidewall insulator and isolation-sidewall insulator mainly made of silicon nitride.

14. The semiconductor device as claimed in claim 1, wherein said active region has a source region or a drain region contacting with said field insulator and including a side face contacting with the side face of said isolation region.

* * * * *